US006832029B2

(12) United States Patent
Roberson

(10) Patent No.: US 6,832,029 B2
(45) Date of Patent: Dec. 14, 2004

(54) IMPEDANCE CONTROL DEVICES FOR USE IN THE TRANSITION REGIONS OF ELECTROMAGNETIC AND OPTICAL CIRCUITRY AND METHODS FOR USING THE SAME

(75) Inventor: Mark W. Roberson, Cary, NC (US)

(73) Assignee: MCNC, Research Triangle Park, NC (US)

( * ) Notice: Subject to any disclaimer, the term of this patent is extended or adjusted under 35 U.S.C. 154(b) by 217 days.

(21) Appl. No.: 10/321,348

(22) Filed: Dec. 17, 2002

(65) Prior Publication Data

US 2004/0114868 A1 Jun. 17, 2004

(51) Int. Cl.[7] .............................................. G02B 6/26
(52) U.S. Cl. ...................................... 385/43; 385/39
(58) Field of Search ............................ 385/39–43, 122, 385/129, 14

(56) References Cited

U.S. PATENT DOCUMENTS

| 4,593,243 | A | * | 6/1986 | Lao et al. .................... 324/754 |
| 5,526,449 | A | * | 6/1996 | Meade et al. .................. 385/14 |
| 6,163,233 | A | * | 12/2000 | Adkins ........................... 333/1 |
| 6,175,337 | B1 | | 1/2001 | Jasper, Jr. et al. |
| 6,317,554 | B1 | * | 11/2001 | Kosaka et al. ............... 385/132 |
| 6,631,236 | B2 | * | 10/2003 | Yamada ....................... 385/129 |
| 6,778,746 | B2 | * | 8/2004 | Charlton et al. ............. 385/122 |
| 6,785,454 | B2 | * | 8/2004 | Abe ............................. 385/123 |
| 2003/0068152 | A1 | * | 4/2003 | Gunn, III .................... 385/129 |
| 2003/0133661 | A1 | * | 7/2003 | Adibi et al. ................... 385/43 |
| 2003/0202764 | A1 | * | 10/2003 | Lee et al. .................... 385/129 |
| 2004/0109644 | A1 | * | 6/2004 | Assefa et al. .................. 385/39 |

* cited by examiner

Primary Examiner—Ellen E. Kim
(74) Attorney, Agent, or Firm—McDermott Will & Emery LLP

(57) ABSTRACT

Impedance control elements that are implemented in conjunction with the transition region of an electromagnetic waveguide to diminish the effect of reflective pulses on the signal transmission and to create linear impedance transition in the transition region are provided for. The device of the present invention provides the stated benefits in electromagnetic waveguides that are capable of high bandwidth signal transmission.

35 Claims, 4 Drawing Sheets

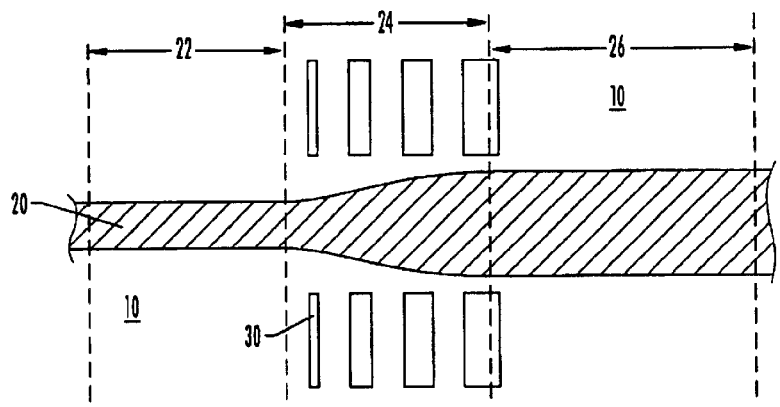
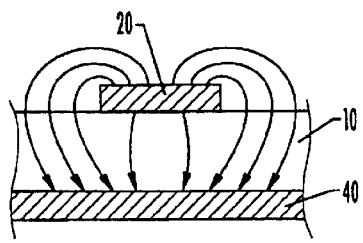
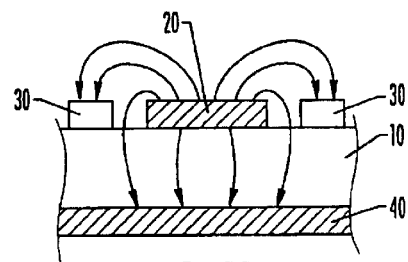
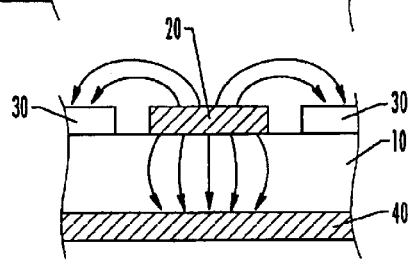
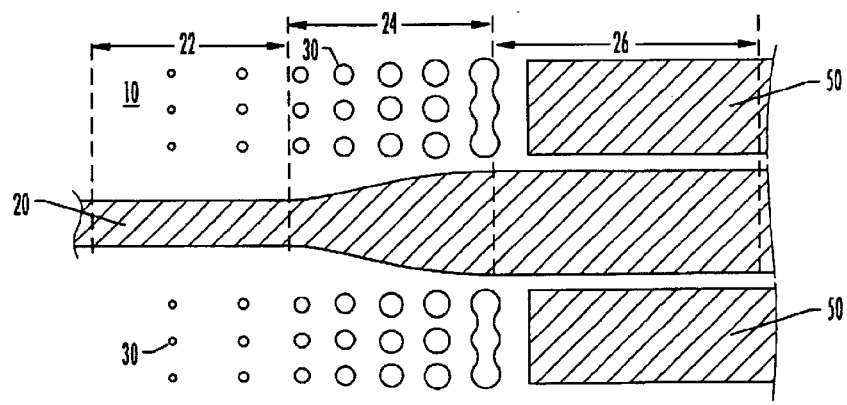

IMPEDANCE CONTROL DEVICES FOR USE IN THE TRANSITION REGIONS OF ELECTROMAGNETIC AND OPTICAL CIRCUITRY AND METHODS FOR USING THE SAME

FIELD OF THE INVENTION

The present invention relates generally to electromagnetic and optical circuitry and, more particularly, impedance control elements that are implemented in conjunction with a transition region of a electromagnetic waveguide to control the impedance or the propagation velocity in the transition region.

BACKGROUND OF THE INVENTION

Microstrip line is one of the most popular types of planar transmission lines, primarily because it can be fabricated by photolithographic processes and is easily integrated with other passive and active microwave devices. Microstrip line is a kind of "high grade" printed circuit construction, consisting of a track of copper or other conductor on an insulating substrate. There is a "backplane" on the other side of the insulating substrate, formed from similar conductor. The track is considered the "hot" conductor and the backplane is considered the "return" conductor. Microstrip is therefore a variant of a two-wire transmission line.

Co-planar waveguides are also instrumental as transmission lines for microwave signals. Typically, a co-planar waveguide is formed by a circuit line bordered on each side of the line by two co-planar waveguides. The co-planar waveguides serve as the ground plane. In most embodiments the co-planar waveguides obviate the need to implement a backplane, such as used in the standard microstrip line described above. Co-planar waveguides benefit from smaller circuit size and greater design freedom in comparison to microstrip line. In addition, co-planar waveguides will typically not require backplane or via processing and, therefore fabrication costs are typically less. However, from a performance standpoint the co-planar waveguide has slightly higher losses and generally poorer power handling capabilities than microstrip line.

In the optical signal realm, an optical waveguide is similar to a microstrip in that it is used as a long transmission line, in this instance to guide an optical signal or light form. It is formed of a solid dielectric filament (i.e., optical fiber). In integrated optical circuits an optical waveguide may consist of a thin dielectric film. The optical waveguide will typically comprise a core consisting of optically transparent material of low attenuation (usually silica glass) and a cladding consisting of optically transparent material of lower refractive index than that of the core. In addition, there are planar dielectric waveguide structures in some optical components, such as laser diodes, which are also referred to as optical waveguides.

In most microstrip lines, co-planar waveguides and optical waveguides a transition region is defined in which the plan view width of the microstrip line or optical waveguide undergoes transition from a first width to a second width. In the transition region a step impedance change occurs due to the change in width. In other words, in the transition region an abrupt change to the opposition to current flow occurs. This abrupt change in impedance causes undesirable reflective pulses to be generated in the opposite direction of the signal pulse.

In previous instances, the problems related to reflective pulses in the transition region of microstrips and optical waveguides have been addressed by various means. In single frequency signal transmission applications, anti-reflective coatings have been applied to the circuits to reduce or eliminate reflective pulses. In applications in which the frequency band is narrow in range, slots have been designed into the transition region of the microstrip or waveguide to combat the problems related to reflective pulses. However, the use of such slotted transition regions is insufficient to rectify the reflective pulse problem in RF circuitry having a high bandwidth range, for example a bandwidth range of 10 Hz to about 10 GHz.

Additionally, microstrips, co-planar waveguides and optical waveguides have been used in conjunction with vertical stacks of impedance control elements, typically vertically stacked fin structures. These fins structures serve to control impedance and propagation velocity in the transition region of the circuit line. However, such structures are expensive to fabricate and typically require precise alignment during fabrication and active alignment during device use.

What is desired is a mechanism that allows for a smooth, linear impedance change in the transition region of a microstrip or optical circuit. Such a mechanism will be able to diminish or eliminate problems with undesirable reflective pulses that are caused by an abrupt change in impedance. A need exists to develop such a mechanism that can be used in high bandwidth range transmission lines. Unlike the vertical stacked impedance control elements, the desired impedance control device will be easy to fabricate, low in cost and will not require precise alignments beyond conventional photolithographic fabrication.

SUMMARY OF THE INVENTION

The present invention provides for impedance control elements that are implemented in conjunction with the transition region of a microstrip, co-planar waveguide or optical waveguide (collectively referred to herein as electromagnetic waveguides) to diminish the effect of reflective pulses on the signal transmission and to create linear impedance transition in the transition region. The device of the present invention provides the stated benefits in electromagnetic waveguides that are capable of high bandwidth signal transmission.

In one embodiment of the invention a device for controlling transition and/or propagation velocity in millimeter wave circuitry includes a substrate, an electromagnetic waveguide disposed on the substrate having a first region defined by a first width, a second region extending from the first region and defined by a transitioning width and a third region extending from the second region and defined by a second width. The second width is greater than the first width. The device additionally includes a plurality of impedance control elements disposed on the substrate adjacent to the second region, the plurality of impedance control elements occupying more planar area on the substrate proximate the third region and decreasing in planar area occupancy as they approach the first region. The plurality of impedance control elements serves to control the reflection of pulses impinging from the first region onto the third region.

In one embodiment of the invention the impedance control elements are defined by line elements that are disposed generally perpendicular to the second region of the electromagnetic waveguide. The line elements will characteristically be narrowest in width proximate the first region and increase in width as they approach the third region.

In yet another embodiment of the invention the impedance control elements are more populous proximate the third region and decrease in population as they approach the first region. The plurality of impedance control elements may be configured in an array, such as a grid-like array, in a quasi-array or in random configuration. Typically the impedance control elements will be disposed on opposing sides of the microstrip/waveguide with a similar configuration on each opposing side. The impedance control elements will typically vary in pitch, density and or geometry as the elements progress from proximate the first region to proximate the third region.

In yet another embodiment of the invention, a method for controlling the impedance and propagation velocity in the transition region of an electromagnetic waveguide is defined as follows. An electromagnetic waveguide is provided that has a first region in which impedance and propagation velocity are generally constant, a second region extending from the first region in which impedance and propagation velocity are generally transitioning and a third region extending from the second region in which impedance and propagation velocity are generally constant. Impedance and velocity control elements are provided adjacent to the second region such that the elements gradually increase in planar density from the area proximate the first region to the area proximate the third region. An electromagnetic field is applied to the waveguide and the impedance and velocity control elements interact in the evanescent field portion of the propagating waves. The impedance and velocity perturbations of the impedance control elements introduce phase shifts and delays to alter the effective impedance and velocity in the electromagnetic waveguide.

As such, the present invention provides for a smooth, linear impedance change in the transition region of an electromagnetic waveguide. The impedance control elements of the present invention are capable of diminishing or eliminating problems with undesirable reflective pulses that are caused by an abrupt change in impedance. The devices and associated methods provide for impedance control and propagation velocity control in high bandwidth range transmission lines.

BRIEF DESCRIPTION OF THE DRAWINGS

FIG. 1 is a plan view diagram of an electromagnetic waveguide incorporating the use of line element impedance control elements, in accordance with one embodiment of the present invention.

FIGS. 2A–2C are cross-sectional diagrams illustrating the effect that the impedance control elements of the present invention have on the voltage field emanating from the microstrip, in accordance with one embodiment of the present invention.

FIG. 3 is a plan view diagram of an electromagnetic waveguide incorporating the use of pitch varying impedance control elements, in accordance with an embodiment of the present invention.

DETAILED DESCRIPTION OF THE INVENTION

Figure 4:
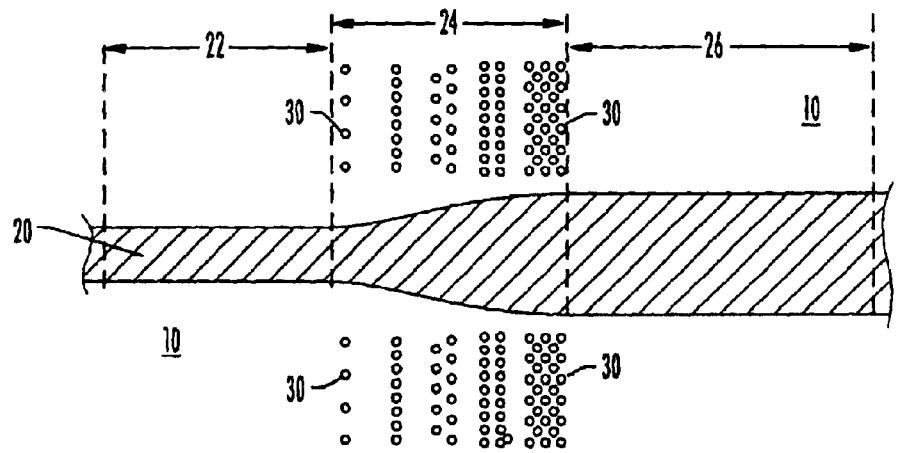
FIG. 4 is a plan view diagram of an electromagnetic waveguide incorporating the use of varying densities of impedance control elements, in accordance with an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring to FIG. 1, shown is a plan view depiction of impedance control elements implemented in conjunction with the transition region of a microstrip, in accordance with an embodiment of the present invention. As will be shown in subsequent figures and discussed below, the impedance control elements can be implemented in conjunction with the transition region of a microstrip, a co-planar waveguide or an optical waveguide. For the purposes of this invention disclosure, a microstrip, a co-planar waveguide and an optical waveguide are collectively referred to as electromagnetic waveguides.

In the FIG. 1 embodiment, a substrate 10 has disposed on a first planar surface an electromagnetic waveguides 20. The opposing second planar surface (shown in FIGS. 2A–2C) will have a ground plane 40 disposed thereon. The electromagnetic waveguide defines three regions. The first region 22 having a first width, a second region 24 having a transitioning width and a third region 26 having a second width. As shown, the second width is greater in length than the first width.

As a pulse of electricity propagates along the electromagnetic waveguide from the first region 22 to the third region 26 it encounters a step impedance change at the second region 24, i.e., the region where the waveguide transitions from a narrow plan view width to a wider plan view width. This step impedance change results in reflective pulses, which alter the velocity of the propagation along the electromagnetic waveguide.

To address the problems related to the step impedance change, the present invention incorporates impedance control elements 30 that are disposed on the substrate adjacent to the second region of the electromagnetic waveguide 20. The impedance control elements serve to reduce or eliminate the reflective pulses by creating intermediate velocities in the second region 24.

The impedance control elements will occupy less planar area nearest the first region 22 of the electromagnetic waveguide 20 and increase in planar area occupancy as they approach the third region 26. The change in planar area occupancy is achieved by altering the density, pitch and/or geometry of the impedance control elements. By gradually increasing the area occupancy of the impedance control elements, the transition from the first region to the third region is less abrupt. The transition that occurs is more linear in nature as opposed to the step change that occurs when the transition region occurs without impedance control elements.

In the embodiment shown in FIG. 1, the impedance control elements 30 are disposed such that they are predominately adjacent to the second region 24 of the electromagnetic waveguide 20. It is also possible and within the inventive concepts herein disclosed to have impedance control elements that are disposed, in addition to being adjacent to the second region 24, adjacent to either the first region 22 or the third region 26. It is also possible and within the inventive concepts herein disclosed to dispose the impedance control elements adjacent to only one side of the electromagnetic waveguide. Disposing the impedance control elements on one side of the electromagnetic waveguide or both sides of the waveguide will be dictated by the application and the space limitation on the substrate.

In a typical embodiment of the invention, the substrate 10 will comprise a dielectric material, such as silicon, germanium, indium phosphate, gallium arsenide, alumina, polytetrafluoroethylene (PTFE), lithium niobate, ceramic and the like. The substrate is typically about 300 micrometers to about 500 micrometers in cross-sectional thickness, although for thinned wafers used in wafer bonding the substrates may be about 100 micrometers in thickness and may even be as thin as about 1 micrometer for certain RF dielectric substrate applications. In embodiments in which the electromagnetic waveguide 20 is a conventional microstrip or a part of a co-planar waveguide it will comprise a conductive material, typically, gold, copper or any other conductive material. The electromagnetic waveguides will generally have a cross-sectional thickness (i.e., height) ranging from about 0.1 micrometers to about 25 micrometers, typically about 1 micrometer to about 10 micrometers. Additionally, the cross-sectional width of the electromagnetic waveguide will range from about 10 micrometers to about 10 millimeters, preferably about 150 micrometers to about 1.5 millimeters. The impedance control elements 30 may comprise a conductive material or a dielectric material depending on the application and the desired impedance control or propagation velocity. If the impedance control elements are formed of a conductive material, gold, copper or the like may be used to form the elements. If the impedance control elements are formed of a dielectric material, silicon nitride ($Si_3N_4$), silicon dioxide ($SiO_2$), alumina ($Al_2O_3$), ceramic, polytetrafluoroethylene (PTFE) or any other suitable dielectric material (i.e., materials that do not provide conductivity at DC frequencies) may be used to form the impedance control elements. Typically, all of the impedance control elements will be formed of the same material. Additional materials would require more layers and/or more mask processing, typically making the use of multiple materials economically impractical. The impedance control elements will generally have a cross-sectional thickness ranging from about 0.1 micrometers to about 25 micrometers, typically about 1 micrometer to about 10 micrometers. The cross-sectional width or diameter of the impedance control elements will be varied and will be dictated by the application and the predetermined pattern of elements. Typically, the impedance control elements will be disposed adjacent to the electromagnetic waveguide beginning at distances ranging from about 20 micrometers to about 500 micrometers.

The impedance control elements will typically be fabricated using conventional semiconductor processing techniques. For example, the elements may be formed photolithographically, using known etch and lift-off methods. Additionally, the elements may be fabricated using reactive ion etching or other forms of micromaching. In embodiments of the invention in which the impedance control elements are formed of a conductive material it is possible to fabricate the impedance control elements and the waveguides as part of the same fabrication process.

FIGS. 2A–2C illustrate cross-sectional diagrams of the electromagnetic waveguides 20 and the associated microwave or electro-optic field lines as they transition from the first region to the second region and the third region, in accordance with an embodiment of the present invention. FIG. 2A represents the waveguide structure in first region, in which the microwave or electro-optic field lines emanate from the electromagnetic waveguide through the substrate 10 to the backplane 40. FIG. 2B represents the waveguide structure 20 and the impedance control elements 30 in the second region (i.e., the transition region). The microwave or electro-optic field lines emanate from the electromagnetic waveguide 20 to the impedance control elements 20 and through the substrate 10 to the backplane 40. FIG. 2C represents the waveguide structure 20 and impedance control elements 30 as it approaches or enters the third region. The microwave or electro-optic filed lines emanate from the waveguide 20 to the impedance control elements 30 and through the substrate 10 to the backplane 40.

In the embodiment of the invention shown in FIG. 1, the impedance control elements are shown as lines generally disposed on the substrate perpendicular to the length of the electromagnetic waveguide. The lines are disposed such that the thinnest width line is nearest the first region and the widest width line is nearest the third region. As will be shown in further figures and discussed in more detail below, the impedance control elements are not limited to the geometry, pitch or density shown in FIG. 1. The application and, to a lesser extent, fabrication constraints will dictate the geometry, pitch and/or density of the impedance control elements. The impedance control elements can be disposed in a symmetric or patterned array or the impedance control elements can be configured in a quasi-periodic array or in asymmetric random pattern. By providing for alternate embodiments of configuration, impedance and/or propagation velocity can be controlled within the waveguide and, specifically, within the second region of the waveguide, to the degree required by the operation of the device. The numerous examples of impedance control elements provided for herein are by way of example only. Other embodiments of impedance control element configuration are also contemplated and within the inventive concepts herein disclosed. FIG. 3 illustrates a plan view diagram of impedance control elements implemented in conjunction with a co-planar waveguide, in accordance with an alternate embodiment of the invention. The co-planar waveguide comprises an electromagnetic waveguide 20 (i.e., the circuit line) having a transition region, i.e., second region 24 and co-planar waveguides 50 adjacent to the third region 26 of the circuit line. The co-planar waveguides serve as ground planes to the adjacent circuit line. In this embodiment the impedance control elements 30 are defined as circular structures generally patterned in a grid-like array configuration with smallest diameter structures nearest the first region 22 and the structures gradually increasing in diameter as they approach the third region 26. As the impedance elements approach the third region the elements fuse together into one contiguous impedance control element. The FIG. 2 embodiment illustrates an implementation in which the impedance control elements are also present adjacent to the first region 22 of the circuit line 20. Presence of impedance control elements in the first region typically provides further smoothening of the impedance transition from the first region to the third region.

The grid-like array configuration impedance control elements provides for impedance control elements to be disposed in rows that extend outwardly from the sides of the microstrip. Typically, space consumption limitations on the substrate will dictate how many rows of control impedance elements the substrate will be able to accommodate. By providing for control elements disposed in rows that extend outward from the sides of the microstrip the impedance transition is further smoothed (i.e., less abrupt). Thus, the general rule is that the more rows of impedance control elements that the substrate can tolerate, the smoother the overall impedance transition will be.

In the FIG. 3 embodiment the impedance control elements differ in terms of pitch (i.e. smaller diameter elements nearest the first region and larger diameter elements nearest the third region). FIG. 4 depicts a plan view diagram of impedance control elements having similar pitch but differing in terms of density based on location in the second region, in accordance with an alternate embodiment of the present invention. The impedance control elements 30 are disposed on the substrate 10 adjacent to the second region 24 of the electromagnetic waveguide 20. The impedance control elements occupy more planar surface area proximate the third region 26 and decrease in planar area occupancy as they approach the first region. In the FIG. 4 embodiment, the impedance control elements 30 have generally equal pitch (i.e., equal diameter), however the mean separation between the elements is greater nearest the first region 22 and the mean separation decreases as they impedance control elements approach the third region 26. Stated in other terms, the density of the impedance transition elements is less nearest the first region and the density of the impedance control elements increases as they approach the third region. The FIG. 4 embodiment illustrates the impedance control elements being aligned in columns 32 with each column representing a different degree of element density. The column alignment configuration is by way of example only and will typically be dictated by application requirements or fabrication limitations.

Figure 5:
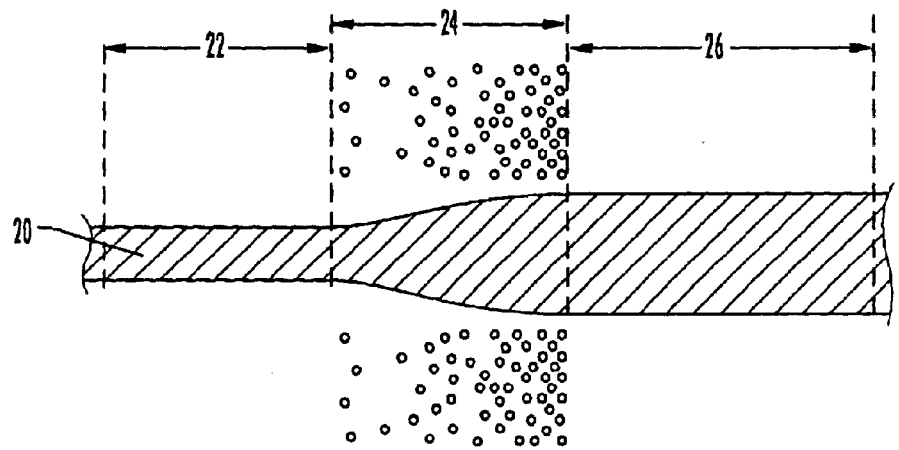
FIG. 5 is a plan view diagram of an electromagnetic waveguide incorporating quasi-random configuration of impedance control elements, in accordance with an embodiment of the present invention.

In an alternate embodiment, as shown in FIG. 5, the impedance control elements 30 have generally equal pitch and are disposed in a more random configuration. The elements have greater mean separation nearest the first region and decreasing mean separation as the elements approach the third region. The impedance control elements occupy more planar surface area proximate the third region 26 and decrease in planar area occupancy as they approach the first region 22.

Figure 6:
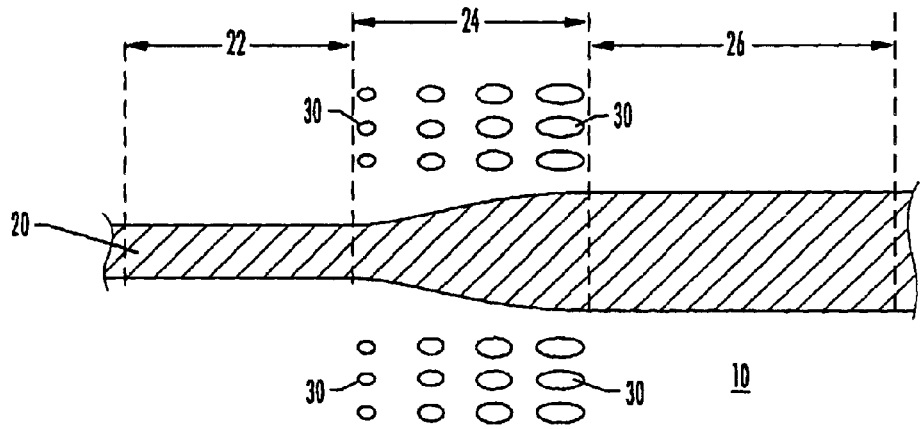
FIGS. 6–8 are plan view diagrams of an electromagnetic waveguide incorporating the use of geometry varying impedance control elements, in accordance with an embodiment of the present invention.
Figure 7:
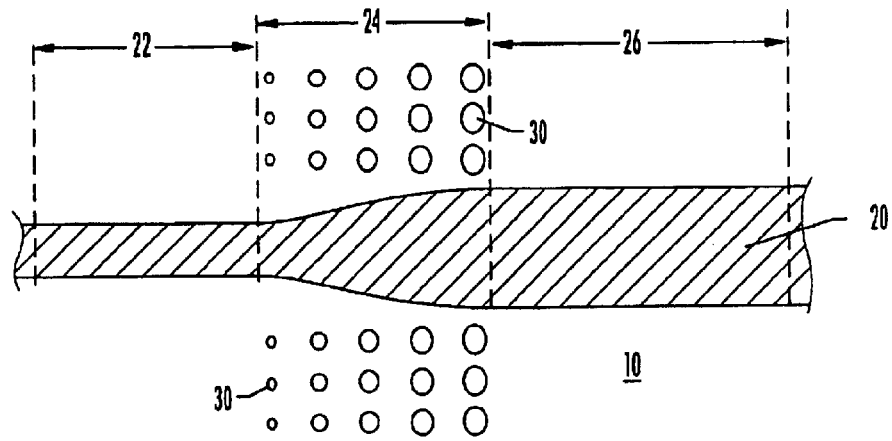
Figure 8:
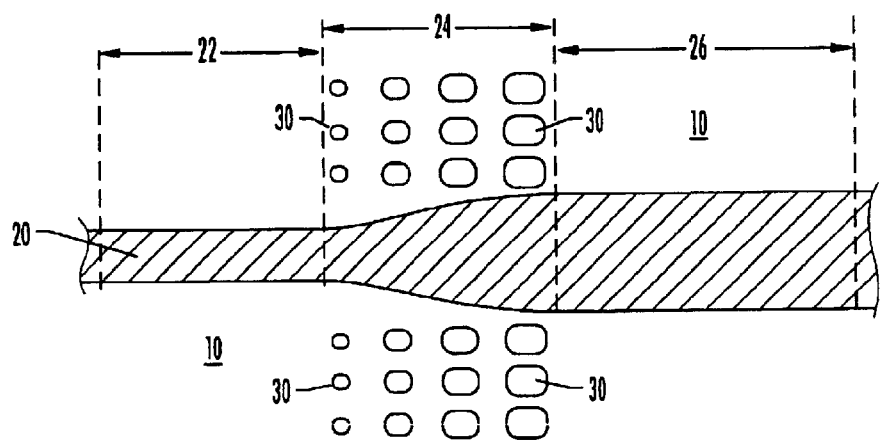

FIGS. 6, 7 and 8 depict a plan view diagrams of impedance control elements having similar center-to-center separation distance and progressive change in geometry, in accordance with an alternate embodiment of the present invention. The impedance control elements 30 are disposed on the substrate 10 adjacent to the second region 24 of the electromagnetic waveguide 20. In the FIG. 6 embodiment the impedance control elements 30 become increasingly more elongated in a longitudinal direction as they progressive from proximate the first region 22 to proximate the third region 24. As such, the impedance control elements occupy more planar surface area proximate the third region 26 and decrease in planar area occupancy as they approach the first region.

In the FIG. 7 embodiment the impedance control elements 30 become increasingly more elongated in a transverse direction as they progressive from proximate the first region 22 to proximate the third region 24. As such, the impedance control elements occupy more planar surface area proximate the third region 26 and decrease in planar area occupancy as they approach the first region.

In the FIG. 8 embodiment the impedance control elements 30 become enlarged in both the longitudinal and transverse direction and, as such, progress from a general circular geometry proximate the first region 22 to a generally square geometry proximate the third region 26. As such, the impedance control elements occupy more planar surface area proximate the third region 26 and decrease in planar area occupancy as they approach the first region. These examples of impedance control elements provide for the linear transition of impedance in the second region to be smoothed to the degree necessary as dictated by the application.

Figure 9:
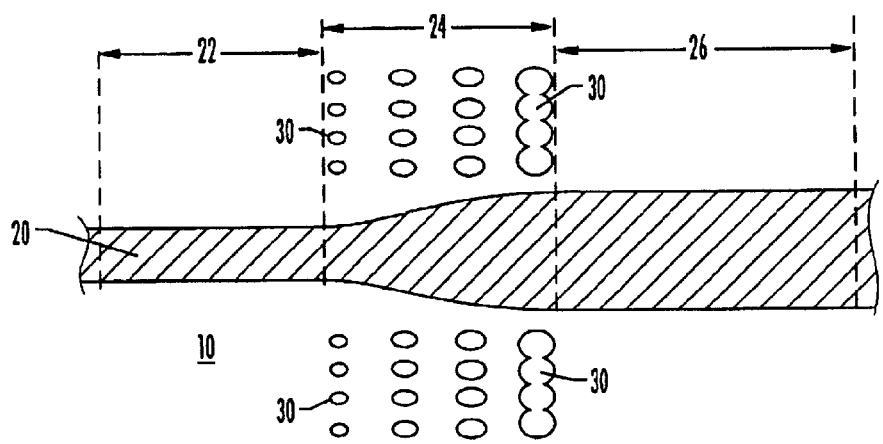
FIG. 9 is a plan view diagram of an electromagnetic waveguide incorporating the use of pitch-varying impedance control elements in which some of the elements have fused, in accordance with an embodiment of the present invention.
Figure 10:
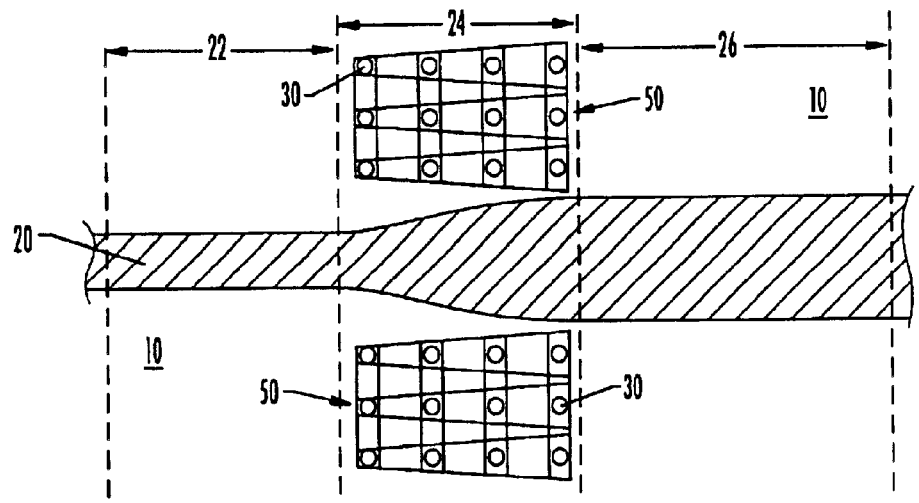
FIG. 10 is a plan view diagram of an electromagnetic waveguide incorporating bridged impedance control elements, in accordance with an embodiment of the present invention.

FIG. 9 depicts a plan view diagram of impedance control elements in which an element proximate the third region is an amalgamation of individual elements, in accordance with an alternate embodiment of the present invention. In the FIG. 9 embodiment the impedance control elements 30 nearest the third region, either by design configuration or incidentally by fabrication processing, have joined together to become one continuous impedance control element. In concurrence with the embodiments previously shown, the impedance control elements occupy more planar surface area proximate the third region 26 and decrease in planar area occupancy as they approach the first region. FIG. 10 illustrates a plan view diagram of a bridged grid configuration of impedance control elements, in accordance with an embodiment of the present invention. The impedance control elements 30 are disposed on the substrate 10 adjacent to the second region 24 of the electromagnetic waveguide 20. The impedance control elements are configured such that a bridge 50 serves to connect the impedance control elements. The bridge structure will typically underlie the impedance control elements and may be formed of a dielectric material or a conductive material. The bridge structure may be formed of the same material used to form the impedance control elements or it may be formed of a dissimilar material. The bridge serves to further the distribution of RF (radio frequency) fields between the impedance control elements. Additionally, the bridge structure may serve to assist in modal shapes and in displacement current discontinuities. As shown in FIG. 10 the width of the bridge elements that are generally parallel to the waveguide structure increase in terms of width from narrowest near the first region to widest nearest the third region. To accommodate width progression, bridge elements that are generally parallel to the waveguide would be tapered with a narrow end proximate the first region and gradually increasing in width as they approach the third region.

Figure 11:
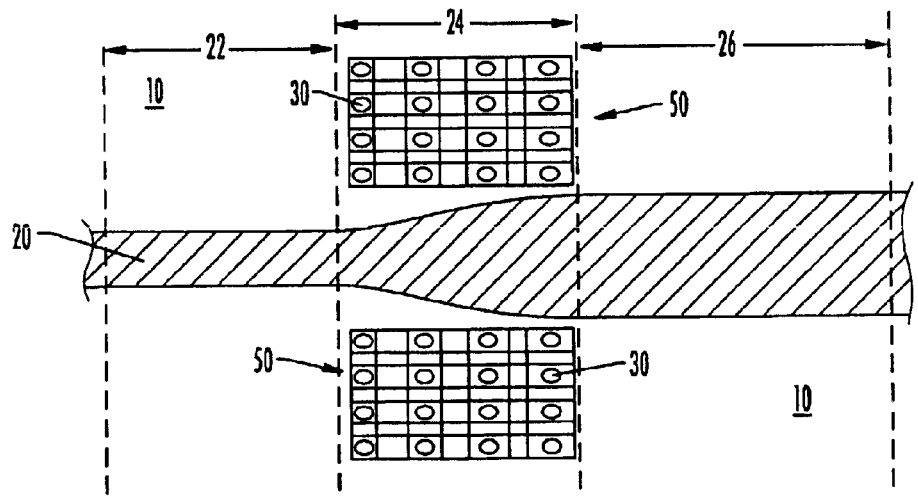
FIG. 11 is a plan view diagram of an electromagnetic waveguide incorporating bridged impedance control elements, in accordance with an embodiment of the present invention.

FIG. 11 illustrates a bridge impedance control structure in which the bridge elements that are generally perpendicular to the waveguide increasing in width from the first region to the third region. As such, the bridge elements that are generally perpendicular to the waveguide have constant widths, with each successive element gradually increasing in width from the first region to the third region.

As previous discussed, the impedance control elements of the present invention may also be used in conjunction with electromagnetic waveguide that take the form of an optical waveguides. Similar to the microstrip or co-planar waveguide embodiments, the optical waveguide will define three regions, a first region having a first width, a second region having a transitioning width and a third region having a second width that is greater than the first width. The impedance control elements will be such that they are disposed generally adjacent to the second region of the optical waveguide. In optical waveguide embodiments, the waveguide may, by way of example, be formed of silicon nitride, silicon dioxide or any other suitable dielectric material capable of transmitting an optical signal. The configurations of the impedance control elements shown in FIGS. 1, 3–11 are equally applicable to embodiments in which signal carrying medium is an optical waveguide. However, the impedance control element configurations shown in the embodiments of FIGS. 1, 3–9 are not meant to be limiting and other configurations of the impedance control elements are contemplated and within the inventive concepts herein disclosed. The specific application and the desired control over the impedance and propagation velocity will dictate the configuration of the impedance control elements.

As such, the present invention provides for a smooth, linear impedance change in the transition region of a microstrip, co-planar waveguide or optical waveguide. The impedance control elements of the present invention are capable of diminishing or eliminating problems with undesirable reflective pulses that are caused by an abrupt change in impedance. The devices and associated methods provide for impedance control and propagation velocity control in high bandwidth range transmission lines.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended Claims. Although specific terms are employed herein, they are used in a generic and descriptive sense only and not for purposes of limitation.

That which is claimed:

1. A device for controlling impedance transition in millimeter wave circuitry, the device comprising:
   a substrate;
   an electromagnetic waveguide disposed on the substrate having a first region defined by a first width, a second region extending from the first region and defined by a transitioning width and a third region extending from the second region and defined by a second width, wherein the second width is greater than the first width; and
   a plurality of impedance control elements disposed on the substrate adjacent to the second region of the electromagnetic waveguide, the plurality of impedance control elements occupying more planar area on the substrate proximate the third region and decreasing in planar area occupancy as they approach the first region,
   wherein the plurality of impedance control elements serve to control the reflection of pulses impinging from the first region onto the third region.

2. The device of claim 1, wherein the electromagnetic waveguide comprises an electromagnetic waveguide chosen from the group consisting of a microstrip, a co-planar waveguide or an optical waveguide.

3. The device of claim 1, wherein the plurality of impedance control elements are more populous proximate the third region and decrease in population as they approach the first region.

4. The device of claim 1, wherein the plurality of impedance control elements change in geometry from an area proximate the first region to an area proximate the third region.

5. The device of claim 1, wherein the impedance control elements are further defined as impedance control lines disposed generally perpendicular to the electromagnetic waveguide and having widths that increase from narrowest nearest the first region to widest nearest the third region.

6. The device of claim 1, wherein the impedance control elements serve to control a signal frequency impinging from the first region onto the third region.

7. The device of claim 1, wherein the impedance control elements serve to control a signal frequency impinging from the third region onto the first region.

8. The device of claim 1, wherein the plurality of impedance control elements are disposed on the substrate adjacent to both sides of the second region of the electromagnetic waveguide.

9. The device of claim 1, wherein the plurality of impedance control elements are disposed on the substrate adjacent to one side of the second region of the electromagnetic waveguide.

10. The device of claim 1, wherein the plurality of impedance control elements are similarly patterned on both sides of the second region of the electromagnetic waveguide.

11. The device of claim 1, wherein the plurality of impedance control elements are disposed on the substrate in a patterned array.

12. The device of claim 11, wherein the patterned array provides for the plurality of impedance control elements to be disposed in an n×m patterned array adjacent to both sides of the second region of the electromagnetic waveguide.

13. The device of claim 1, wherein the plurality of impedance control elements are further defined as generally circular structures.

14. The device of claim 13, wherein the generally circular structures are largest proximate the third region and gradually decrease in size as they approach the first region.

15. The device of claim 1, wherein the plurality of impedance control elements are further defined as generally rectangular shaped structures proximate the third region and transition to generally circular structures as they approach the first region.

16. The device of claim 1, wherein the plurality of impedance control elements are disposed on the substrate in a quasi-random pattern.

17. The device of claim 1, wherein the plurality of impedance control elements are disposed substantially within the same horizontal plane.

18. The device of claim 1, wherein the plurality of impedance control elements and the electromagnetic waveguide are disposed substantially within the same horizontal plane.

19. The device of claim 1, wherein the plurality of impedance control elements are formed from a material chosen from the group consisting of a metal and a dielectric material.

20. A device for controlling impedance transition in optical circuitry, the device comprising:
   a substrate;
   an optical waveguide disposed on the substrate having a first region defined by a first width, a second region extending from the first region and defined by a transitioning width and a third region extending from the second region and defined by a second width, wherein the second width is greater than the first width; and a plurality of impedance control elements disposed on the substrate adjacent to the second region, the plurality of impedance control elements occupying more planar area on the substrate proximate the third region and decreasing in planar area occupancy as they approach the first region, wherein the plurality of impedance control elements serve to control the reflection of pulses impinging from the first region onto the third region.

21. The device of claim 20, wherein the plurality of impedance control elements are more populous proximate the third region and decrease in population as they approach the first region.

22. The device of claim 20, wherein the impedance control elements serve to control a signal frequency impinging from the first region onto the third region.

23. The device of claim 20, wherein the plurality of impedance control elements are similarly patterned on both sides of the second region of the optical waveguide.

24. The device of claim 20, wherein the impedance control elements are further defined as impedance control lines disposed generally perpendicular to the optical waveguide and having widths that increase from narrowest nearest the first region to widest nearest the third region.

25. The device of claim 20, wherein the plurality of impedance control elements are disposed substantially within the same horizontal plane.

26. The device of claim 20, wherein the plurality of impedance control elements and the optical waveguide are disposed substantially within the same horizontal plane.

27. A device for controlling impedance transition in co-planar waveguides, the device comprising:

a substrate;

a electromagnetic waveguide disposed on the substrate having a first region defined by a first width, a second region extending from the first region and defined by a transitioning width and a third region extending from the second region and defined by a second width, wherein the second width is greater than the first width;

first and second ground plane structures disposed co-planar to the circuit line and adjacent to opposite sides of the third region of the circuit line; and a plurality of impedance control elements disposed on the substrate adjacent to the second region, the plurality of impedance control elements occupying more planar area on the substrate proximate the third region and decreasing in planar area occupancy as they approach the first region, wherein the plurality of impedance control elements serve to control the reflection of pulses impinging from the first region onto the third region.

28. The device of claim 27, wherein the plurality of impedance control elements are more populous proximate the third region and decrease in population as they approach the first region.

29. The device of claim 27, wherein the impedance control elements serve to control a signal frequency impinging from the first region onto the third region.

30. The device of claim 27, wherein the plurality of impedance control elements are similarly patterned on both sides of the second region of the electromagnetic waveguide.

31. The device of claim 27, wherein the impedance control elements are further defined as impedance control lines disposed generally perpendicular to the electromagnetic waveguide and having widths that increase from narrowest nearest the first region to widest nearest the third region.

32. The device of claim 27, wherein the plurality of impedance control elements are disposed substantially within the same horizontal plane.

33. The device of claim 27, wherein the plurality of impedance control elements, the electromagnetic waveguide and the first and second ground plane structures are disposed substantially within the same horizontal plane.

34. A method for altering propagation velocity in an electromagnetic waveguide, the method comprising the steps of:

providing for an electromagnetic waveguide having a first region of substantially constant propagation velocity, a second region extending from the first region having transitioning propagation velocity and a third region extending from the second region having generally constant propagation velocity;

providing for velocity control elements adjacent planar to the second region of the electromagnetic waveguide, the velocity control elements increasing in planar density from an area proximate the first region to an area proximate the third region;

creating an electromagnetic propagating wave signal in the electromagnetic waveguide;

causing interaction between the velocity control elements and the electromagnetic propagating wave signal; and introducing delays in the electromagnetic propagating wave signal to alter the effective velocity in the second region of the waveguide.

35. A method for altering impedance in an electromagnetic waveguide, the method comprising the steps of:

providing for an electromagnetic waveguide having a first region of substantially constant impedance, a second region extending from the first region having transitioning propagate impedance and a third region extending from the second region having generally constant impedance;

providing for impedance control elements adjacent planar to the second region of the electromagnetic waveguide, the impedance control elements increasing in planar density from an area proximate the first region to an area proximate the third region;

creating an electromagnetic propagating wave signal in the electromagnetic waveguide;

causing interaction between the impedance control elements and the electromagnetic propagating wave signal; and introducing phase shifts in the electromagnetic propagating wave signal to alter the effective impedance in the second region of the waveguide.

* * * * *